US012795813B2

(12) United States Patent
Lou et al.

(10) Patent No.: US 12,795,813 B2
(45) Date of Patent: Nov. 10, 2026

(54) PRINTED CIRCUIT BOARD TRACE WITH FORMATIONS

(71) Applicant: Cisco Technology, Inc., San Jose, CA (US)

(72) Inventors: Jianquan Lou, Shanghai (CN); Alpesh Umakant Bhobe, Sunnyvale, CA (US)

(73) Assignee: Cisco Technology, Inc., San Jose, CA (US)

(*) Notice: Subject to any disclaimer, the term of this patent is extended or adjusted under 35 U.S.C. 154(b) by 222 days.

(21) Appl. No.: 18/629,076

(22) Filed: Apr. 8, 2024

(65) Prior Publication Data

US 2025/0318044 A1 Oct. 9, 2025

(51) Int. Cl.
*H05K 1/02* (2006.01)

(52) U.S. Cl.
CPC ......... *H05K 1/0242* (2013.01); *H05K 1/0245* (2013.01); *H05K 2201/09281* (2013.01)

(58) Field of Classification Search
CPC ....... H05K 2201/09281; H05K 1/0242; H05K 1/0245
See application file for complete search history.

(56) References Cited

U.S. PATENT DOCUMENTS

| | | | | |
|---|---|---|---|---|
| 2008/0082950 | A1 | 4/2008 | Mathews | |
| 2014/0196941 | A1 | 7/2014 | Hidaka et al. | |
| 2019/0289710 | A1 | 9/2019 | Kumar et al. | |
| 2020/0253036 | A1 | 8/2020 | Chandra et al. | |
| 2020/0375025 | A1 | 11/2020 | Kim et al. | |
| 2021/0144842 | A1* | 5/2021 | Liu | H05K 1/0216 |
| 2023/0156913 | A1* | 5/2023 | Nishio | H01P 3/085 174/255 |
| 2023/0254966 | A1 | 8/2023 | Rowlands et al. | |
| 2024/0407093 | A1* | 12/2024 | Dsilva | H05K 1/0248 |

* cited by examiner

*Primary Examiner* — Jeremy C Norris

(74) *Attorney, Agent, or Firm* — Edell, Shapiro, Finnan, LLC

(57) ABSTRACT

Provided herein is a trace routed along a layer of a printed circuit board. The trace includes a bend that has a linear segment extending parallel to an axis. The linear segment includes a first side and a second side, opposite the first side, that each extend parallel to the axis, and the linear segment includes a cutout formed into the first side toward the second side. An end of the cutout overlaps with the second side along the axis. The trace also includes an extension extending toward an additional trace adjacent to the trace. The extension and the cutout are provided to tune an inductance and/or a capacitance of the trace toward an adjacent trace such that the inductance and/or the capacitance of the trace and of the adjacent trace are approximately equal to one another.

20 Claims, 6 Drawing Sheets

PRINTED CIRCUIT BOARD TRACE WITH FORMATIONS

TECHNICAL FIELD

The present disclosure relates to printed circuit boards (PCBs) and traces of PCBs.

BACKGROUND

A printed circuit board (PCB) electrically couples various electronic components with one another. For example, a PCB may include multiple layers, each having different electronic components. Additionally, the PCB may include traces that propagate signals to enable communication between the electronic components. The propagation characteristics of a signal along a trace may be dependent on the routing of the trace. However, it may be difficult to provide a trace that propagates a signal desirably, such as for a target duration of time and/or without introducing excessive electromagnetic issues.

DETAILED DESCRIPTION

Overview

Figure 1:
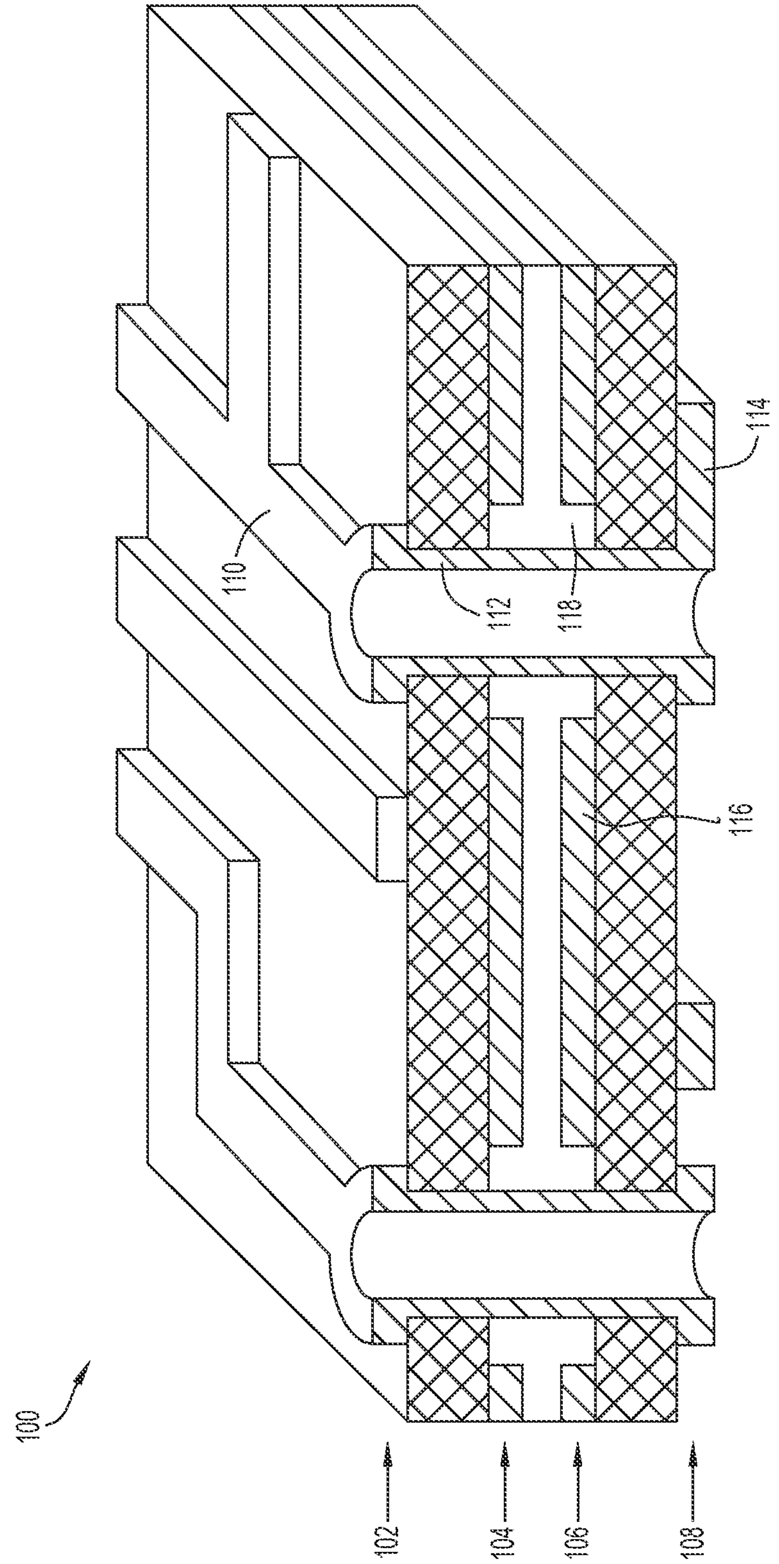
FIG. 1 is a perspective cross-sectional view of a portion of a printed circuit board (PCB) that includes multiple layers and traces routed along each layer, according to an example embodiment.

Techniques are provided herein for a printed circuit board (PCB). In some aspects, an apparatus includes: a layer of a printed circuit board; and a trace routed along the layer of the printed circuit board, wherein the trace comprises a bend partially formed by a linear segment extending parallel to an axis, the linear segment includes a first side and a second side, opposite the first side, that each extend parallel to the axis, the linear segment includes a cutout formed into the first side toward the second side, and an end of the cutout overlaps with the second side along the axis.

In other aspects, an apparatus includes: a layer of a printed circuit board; a first trace routed along the layer of the printed circuit board; and a second trace routed along the layer of the printed circuit board, wherein the second trace comprises a bend at least partially formed by a segment, and the second trace comprises an extension extending from the segment toward the first trace.

In further aspects, an apparatus includes: a layer of a printed circuit board; and a trace routed along the layer of the printed circuit board, wherein the trace comprises a bend partially formed by a linear segment extending along an axis, the linear segment comprises a cutout formed into a first side of the linear segment, and the linear segment comprises an extension extending from a second side, opposite the first side, of the linear segment, and the cutout and the extension are offset from one another along the axis.

EXAMPLE EMBODIMENTS

Embodiments of the present disclosure are directed to a trace routed along a layer of a printed circuit board (PCB). The trace may be configured to propagate a signal during operation of the PCB. For example, the trace may transmit a signal to an electronic component at the layer of the PCB and/or to a via that extends through multiple layers of the PCB to transmit the signal to another layer of the PCB.

The trace may include a formation to propagate a signal desirably. As an example, the trace may include a bend that includes multiple linear segments extending transverse to one another. The bend may cause the trace to extend a desirable length to enable a signal to propagate along the trace for a target duration of time. For instance, it may be desirable for a total length of the trace to substantially match a total length of an additional trace such that a duration of time for a signal to propagate along the trace substantially matches a duration of time for a signal to propagate along the additional trace (e.g., the trace and the additional trace may be a differential pair configured to propagate positive signals and negative signals, respectively). Thus, respective signals propagated along the trace and along the additional trace may be synchronized to reach a target destination at approximately the same time.

Additionally, the trace may include an extension and/or a cutout formed at the bend. The extension may extend from one of the linear segments, and the cutout may be formed into one of the linear segments. While the extension and the cutout may change a geometry of the linear segment, the extension and the cutout may not change a total distance for signals to travel to propagate along the trace. As such, the extension and the cutout may not affect a time of propagation of signals along the linear segment and therefore along the trace. Instead, the extension may change a capacitance of the trace, and the cutout may change an inductance of the trace. For example, it may be desirable for the capacitance and the inductance of the trace to match that of the additional trace to reduce EMI and noise generation that otherwise may occur as a result of excessive differences in capacitance/inductance to affect signal integrity. Thus, the extensions and cutouts may be formed to tune the capacitance and the inductance of the trace toward that of the additional trace to maintain desirable signal integrity and therefore performance of the PCB.

With reference made to FIG. 1, depicted therein is a cross-sectional view of a PCB 100 having a first layer 102 (e.g., a first external layer), a second layer 104 (e.g., a first internal layer), a third layer 106 (e.g., a second internal layer), and a fourth layer 108 (e.g., a second external layer). Each layer 102, 104, 106, 108 may include different electrical components, such as resistors, transistors, capacitors, switches, inductors, transformers, sensors, diodes, relays, and so forth. The PCB 100 may additionally include vias that may extend through the layers 102, 104, 106, 108 and electrically couple electrical components of the different layers 102, 104, 106, 108 to one another. For example, a first trace 110 may extend from a via 112 and along the first layer 102 to electrically couple the via 112 to electrical components of the first layer 102, and a second trace 114 may extend from the via 112 and along the fourth layer 108 to electrically couple the via 112 to electrical components of the fourth layer 108. As such, a signal (e.g., an electrical signal) may propagate along the first trace 110, the via 112, and the second trace 114 to electrically couple the electrical components of the first layer 102 and of the fourth layer 108 to one another.

However, the via 112 may not be electrically coupled to electrical components of the second layer 104 and/or of the third layer 106. To this end, no trace may extend from the via 112 and along the second layer 104 or along the third layer 106. For instance, a third trace 116 may extend along the third layer 106 but may terminate prior to contacting the via 112. Instead, a void of space or antipad 118 may surround the via 112 at the third layer 106. The antipad 118 may block or interrupt electrical coupling between the via 112 and traces (e.g., the third trace 114) extending along the third layer 106 and along the second layer 104.

It may be desirable to configure traces of the PCB 100 to propagate signals in a certain manner. For instance, it may be desirable for a signal to propagate along the first trace 110 for a target duration of time that may be similar to a duration of time in which another signal propagates along an additional trace to synchronize the first trace 110 and the additional trace with one another (e.g., to enable the first trace 110 and the additional trace to propagate respective signals that are received by a target destination, such as an electronic component, at approximately the same time). To this end, the first trace 110 may be routed to cause signals to travel a certain distance along the first trace 110 (e.g., approximately the same distance for signals to travel along the additional trace) to enable the signal to propagate along the first trace 110 for the target duration of time. As a result, respective signals propagating along the first trace 110 and along the additional trace may have corresponding travel times, thereby reducing skew (e.g., fiber glass skew, glass weave skew, fiber weave skew, phase skew, timing skew, line-to-line skew, positive/negative skew), which is a difference between the respective durations of time in which signals travel along traces and may otherwise affect an integrity of communication between electronic components of the PCB 100 to affect performance operations (e.g., signal response behavior, signal integrity, link performance, bit-error-rate performance, communication channel budget, and electromagnetic interference).

However, routing the first trace 110 to travel the certain distance may introduce differences in capacitance and/or inductance between the first trace 110 and the additional trace. Such differences may generate EMI and noise, which may affect (e.g., reduce) integrity of the signals propagated along the first trace 110 and the additional trace. Embodiments of the present disclosure are directed to providing formations (e.g., to the first trace 110, to the additional trace) to mitigate the differences in capacitance and/or inductance to reduce EMI and noise, thereby achieving desirable signal integrity and corresponding performance of the PCB 100.

Each of FIGS. 2-5 illustrates a pair of traces in which one or both traces include formations. In some embodiments, an illustrated pair of traces may be a differential pair configured to propagate signals of equal magnitude and opposite polarity (i.e., positive signals, negative signals). In additional or alternative embodiments, an illustrated pair of traces may be single ended traces configured to propagate uncoupled signals. In any case, the traces may be routed such that signals propagated along the traces may traverse the traces for similar durations of time, and the formations may be provided to tune the inductances and/or capacitances of the traces toward one another and maintain desirable integrity of the signals propagated along the traces.

Figure 2:
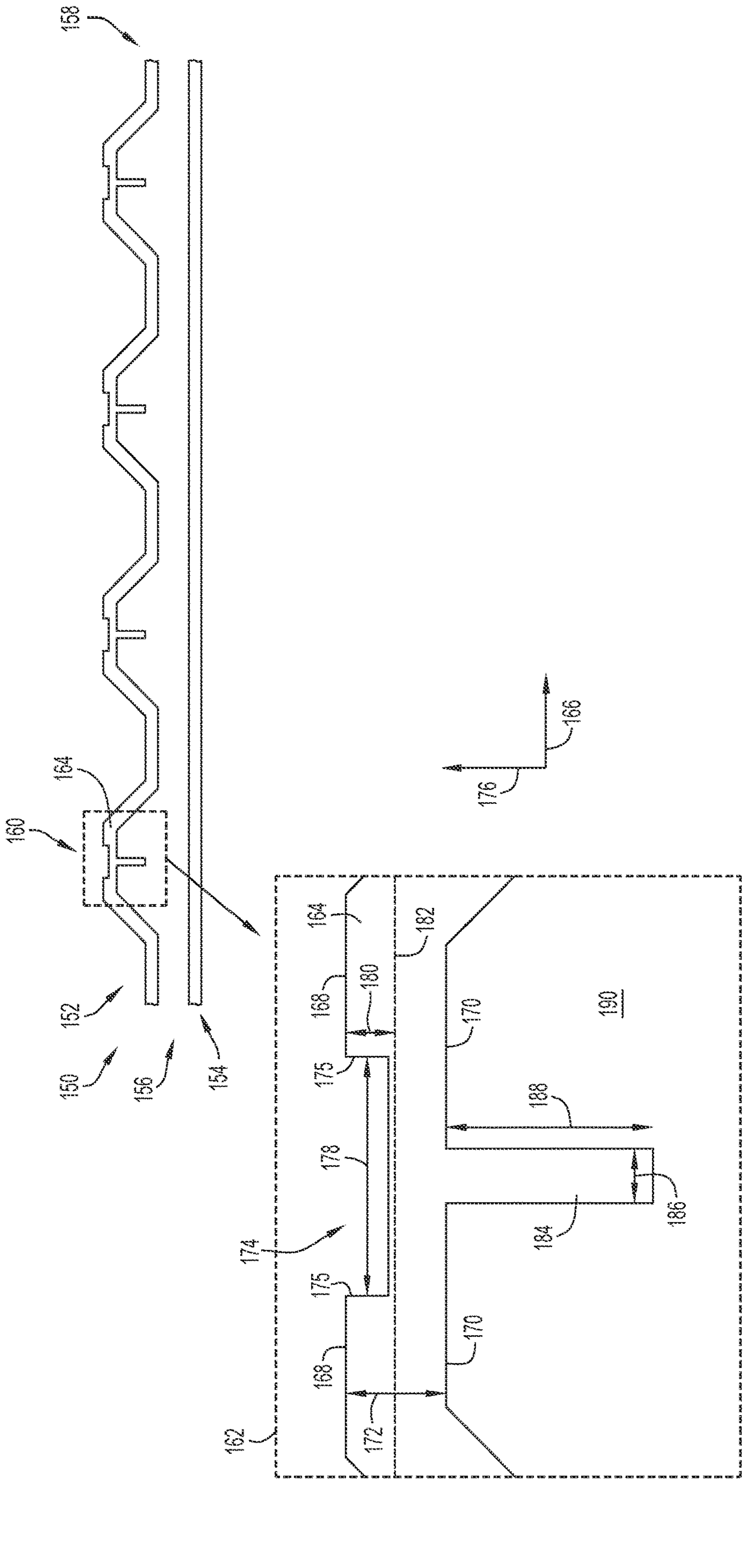
FIGS. 2-5 are each a schematic diagram illustrating different traces routed along a layer of a PCB, at least some of the traces having formations to propagate signals desirably, according to an example embodiment.

FIG. 2 is a schematic diagram of a portion of a pair of traces 150. The pair of traces 150 may include a first trace 152 and a second trace 154. Each of the traces 152, 154 may extend to propagate a signal from a first end 156 to a second end 158 of the portion of the pair of traces 150. The second trace 154 may extend linearly from the first end 156 to the second end 158 (e.g., the second trace 154 does not include any bends). However, the first trace 152 may have bends 160 between the first end 156 and the second end 158. As such, a length of the first trace 152 extending from the first end 156 to the second end 158 may be greater than a length of the second trace 154 extending from the first end 156 to the second end 158. Therefore, signals propagated along the first trace 152 may travel a greater distance than that traveled by signals propagated along the second trace 154.

Such routing of the first trace 152 relative to the second trace 154 may reduce skew between the first trace 152 and the second trace 154. As an example, at other portions of the pair of traces 150, the second trace 154 may have a greater length than that of the first trace 152. Thus, the bends 160 of the first trace 152 may increase the total length of the first trace 152 toward the total length of the second trace 154. That is, the bends 160 of the first trace 152 may enable a total length of the first trace 152 and a total length of the second trace 154 to substantially match one another. As another example, signals propagated along the first trace 152 may be at a faster speed than signals propagated along the second trace 154. For instance, the first trace 152 may be routed along a different material (e.g., different fiber glass substrate portions) than that along which the second trace 154 is routed to cause a difference in travel speed of signals propagated along the traces 152, 154. Thus, the length of the first trace 152 may be increased by way of the bends 160 such that the signals propagated at a relatively higher speed along the first trace 152 may travel a greater distance than signals propagated at a relatively lower speed along the second trace 154. As a result, signals may traverse the first trace 152 and the second trace 154 for similar durations of time, even though the signals propagated along the first trace 152 may travel at a relatively faster speed.

However, the bends 160 may change certain properties, such as an inductance and/or a capacitance, of the first trace 152. For this reason, various formations may be provided to compensate for the changes in properties introduced by the bends 160. In other words, the formations tune the properties, such as to reduce a difference between the properties of the first trace 152 as compared to those of the second trace 154. Detailed view 162 further illustrates formations provided to the first trace 152 at one of the bends 160. In particular, each bend 160 may include multiple linear segments 164 extending transverse to one another (e.g., in a U-shaped or V-shaped arrangement). Detailed view 162 illustrates formations provided to one of such linear segments 164 that extends parallel to the second trace 154.

For example, the linear segment 164 extends along (e.g., parallel to) a first axis 166 (e.g., a longitudinal axis) that may be parallel to the second trace 154 to propagate signals along the first axis 166. The linear segment 164 may include a first side 168 and a second side 170, opposite the first side 168, and each side 168, 170 may extend along (e.g., parallel to) the first axis 166. The sides 168, 170 may be offset from one another by a distance 172 (e.g., a width) along a second axis 176 (e.g., a lateral axis), perpendicular to the first axis 166. The formations may be provided to adjust a dimension of the linear segment 164 along the second axis 176 (e.g., such that the dimension of the linear segment 164 varies from the distance 172 between the sides 168, 170). In some embodiments, the formations may include a cutout 174, which is illustrated as being formed into the first side 168 and toward the second side 170 along the second axis 176. The cutout 174 may reduce an amount of material of the first trace 152 to increase an inductance of the first trace 152. The illustrated cutout 174 has a rectangular shape that includes a first dimension 178 (e.g., a length) and a second dimension 180 (e.g., a width) that is less than the first dimension 178. However, it should be noted that the second dimension 180 of the cutout 174 may be greater than the first dimension 178 in additional or alternative embodiments. In further embodiments, the cutout 174 may have any other suitable shape, such as a circular shape, a triangular shape, an irregular shape, and so forth, and/or the cutout 174 may be formed into the second side 170 and toward the first side 168 along the second axis 176.

The cutout 174 may also be formed to avoid changing a direction of travel of signals along the linear segment 164 to avoid undesirably changing a distance traveled by the signals along the first trace 152 (e.g., to undesirably affect a duration of time for the signals to traverse the first trace 152). That is, the linear segment 164 may still transmit signals generally along the first axis 166 despite the presence of the cutout 174. To this end, ends 175 (e.g., an initiating end and an oppositely located terminating end that are offset along the first axis 166) of the cutout 174 may overlap with a portion of the second side 170 along the first axis 166. As such, even though the ends 175 of the cutout 174 may change a geometry of the linear segment 164 along the second axis 176, the second side 170 of the linear segment 164 opposite of the ends 175 of the cutout 174 along the second axis 176 continues to extend along the first axis 166 to enable signals to propagate along the first axis 166 between the second side 170 and the cutout 174. Additionally or alternatively, the cutout 174 may be sized to block directional changes of signals propagated along the linear segment 164, thereby enabling signals to continue to travel along the first axis 166. As an example, the cutout 174 may terminate prior to the second side 170 to enable signals to propagate through the linear segment 164 along the first axis 166 by way of at least the second side 170. For instance, a center axis 182 may extend along the first axis 166 midway between the first side 168 and the second side 170 (i.e., the center axis 182 is equidistant to the first side 168 and the second side 170), and the cutout 174 may terminate prior to the center axis 182. That is, a distance between the first side 168 and the center axis 182 along the second axis 176 may be greater than the second dimension 180 of the cutout 174. However, in additional or alternative embodiments, the cutout 174 may terminate between the center axis 182 and the second side 170. In either case, the cutout 174 may be formed to avoid changing a direction of signals. In this manner, the cutout 174 may adjust the inductance of the first trace 152 to improve signal integrity without changing a time of propagation along the first trace 152 that otherwise may cause skew between the traces 152, 154.

In additional or alternative embodiments, the formations may include an extension 184 (e.g., a stub). The illustrated extension 184 extends from the second side 170 along the second axis 176. For example, the extension 184 may include a rectangular shape having a first dimension 186 (e.g., a width) and a second dimension 188 (e.g., a length) that is greater than the first dimension 186. However, the second dimension 188 of the extension 184 may be less than the first dimension 186 in additional or alternative embodiments. In further embodiments, the extension 184 may have any other suitable shape, such as an arcuate shape, a triangular shape, an irregular shape, and so forth. Moreover, the illustrated extension 184 may extend from the linear segment 164 toward the second trace 154 into a space 190 between the traces 152, 154. Such an arrangement of the extension 184 may limit an outer boundary occupied by the pair of traces 150. For instance, extending the extension 184 from the linear segment 164 away from the second trace 154 (e.g., by extending the extension 184 from the first side 168 instead of from the second side 170) may increase the outer boundary occupied by the pair of traces 150 and reduce efficiency of space utilized by the pair of traces 150. However, in other embodiments, the extension 184 may extend from the linear segment 164 at least partially away from the second trace 154.

The extension 184 may increase a capacitance of the first trace 152 and also decrease an inductance of the first trace 152. Therefore, each of the cutout 174 and the extension 184 may be used to change an inductance of the first trace 152, whereas the extension 184, but not the cutout 174, may primarily be used to change a capacitance of the first trace 152. For this reason, in order to tune the capacitance and the inductance of the first trace 152 toward that of the second trace 154, the cutout 174 and the extension 184 may cooperatively be utilized. By way of example, the extension 184 may be provided to tune the capacitance of the first trace 152 toward the capacitance of the second trace 154. However, the implementation of the extension 184 may also change the inductance of the first trace 152 (e.g., away from the inductance of the second trace 154). As such, the cutout 174 may be formed to tune the inductance of the first trace 152 toward the inductance of the second trace 154. Consequently, the cutout 174 and the extension 184 may cooperatively tune the capacitance and the inductance of the first trace 152 to match those of the second trace 154 to maintain desirable signal integrity.

The extension 184 may also be formed to avoid changing a direction of travel of signals along the linear segment 164 to avoid undesirably changing a distance traveled by the signals along the first trace 152 (e.g., to undesirably affect a duration of time for signals to traverse the first trace 152). For example, the first dimension 186 and/or the second dimension 188 of the extension 184 may be sufficiently small to avoid redirecting signals (e.g., away from travel along the second side 170) that are traveling along the first axis 166. Moreover, the extension 184 may be positioned offset from each end 175 of the cutout 174 along the first axis to enable the ends 175 of the cutout 174 to align with the second side 170 of the linear segment 164 extending along the first axis 166. For instance, overlap between one of the ends 175 of the cutout 174 and the extension 184 may otherwise urge signal propagation in a direction along the second axis 176 (e.g., away from the cutout 174 and toward the extension 184) instead of along the first axis 166 to undesirably change a distance and duration of time of signal propagation along the linear segment 164. Thus, such overlap may be avoided to propagate signals desirably along the linear segment 164 (e.g., continually along the first axis 166). Moreover, the cutout 174 may not extend into the extension 184 to avoid changing a direction of signals that otherwise may increase a distance of travel along the linear segment 164 to introduce potential skew. That is, because the extension 184 extends from the second side 170 and the cutout 174 terminates prior to the second side 170, the cutout 174 terminates prior to the extension 184. As such, signals may continue to travel through the linear segment 164 along the first axis 166 by way of at least the second side 170 at where the cutout 174 and the extension 184 overlap with one another along the first axis 166. In this way, the extension 184 may adjust the inductance and/or capacitance of the first trace 152 to improve signal integrity without changing a time of propagation along the first trace 152 that otherwise may introduce skew issues within the pair of traces 150.

Figure 3:
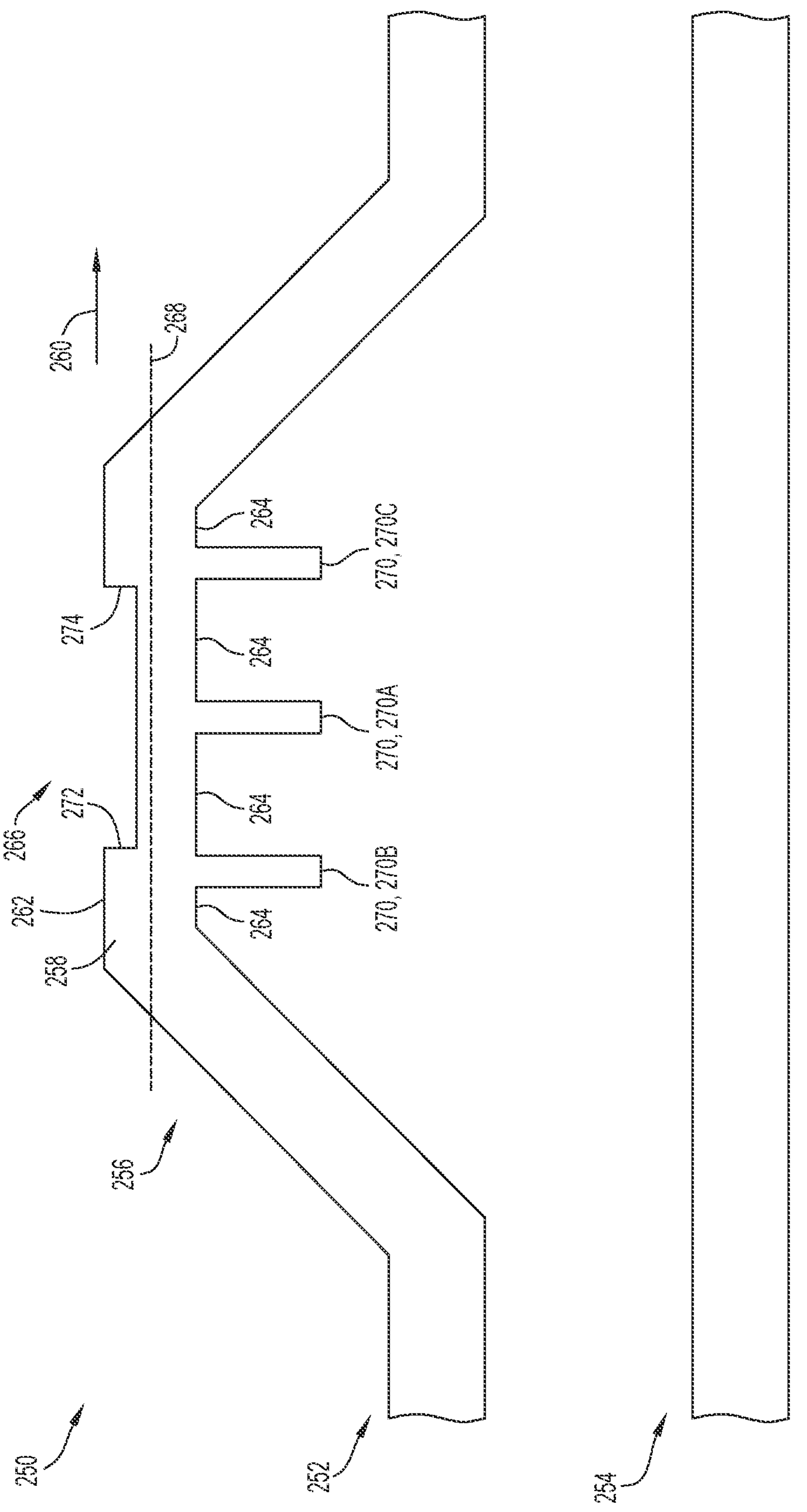

FIG. 3 is a schematic diagram of a portion of a pair of traces 250 that includes a first trace 252 and a second trace 254. The first trace 252 may include a bend 256, whereas the second trace 254 may extend linearly (e.g., does not include a bend). The bend 256 of the first trace 252 may include a linear segment 258 extending along (e.g., parallel to) an axis 260 and having formations to tune an inductance and/or a capacitance of the first trace 252 (e.g., toward those of the second trace 254). For example, the linear segment 258 may include a first side 262 and a second side 264, opposite the first side 262, that may each extend along (e.g., parallel to) the axis 260, and a cutout 266 may be formed into the first side 262 and extending toward the second side 264 to increase an inductance of the linear segment 258. The illustrated cutout 266 terminates prior to a center axis 268 extending between the first side 262 and the second side 264 to avoid changing a direction of travel of signals along the linear segment 258, but the cutout 266 may terminate between the center axis 268 and the second side 264 in additional or alternative embodiments.

The linear segment 258 may also include multiple extensions 270 extending from the second side 264 in a direction transverse to the axis 260 (e.g., toward the second trace 254) to increase a capacitance and decrease an inductance of the first trace 252. A first extension 270A may overlap with the cutout 266 along the axis 260. However, a second extension 270B and a third extension 270C may be offset from the cutout 266 along the axis 260. As an example, a first end 272 of the cutout 266 and a second end 274, opposite the first end 272, of the cutout 266 may be positioned between the second extension 270B and the third extension 270C along the axis 260. Accordingly, the first end 272 and the second end 274 of the cutout 266 may overlap with a portion of the second side 264 extending along the axis 260. Although the illustrated linear segment 258 includes three extensions 270, it should be noted that the linear segment 258 may include any quantity of extensions, such as two extensions 270 or more than three extensions 270. In such embodiments, the ends 272, 274 of the cutout 266 may be offset from each extension 270 along the axis 260 and, instead, may overlap with a portion of the second side 264 along the axis 260.

The arrangement of the cutout 266 and the extensions 270 may adjust the inductance and/or the capacitance of the first trace 252 to improve signal integrity without changing a direction of travel of signals along the linear segment 258. Therefore, a difference between the inductance and/or the capacitance of the first trace 252 relative to those of the second trace 254 may be reduced while limiting skew between the traces 252, 254.

Figure 4:
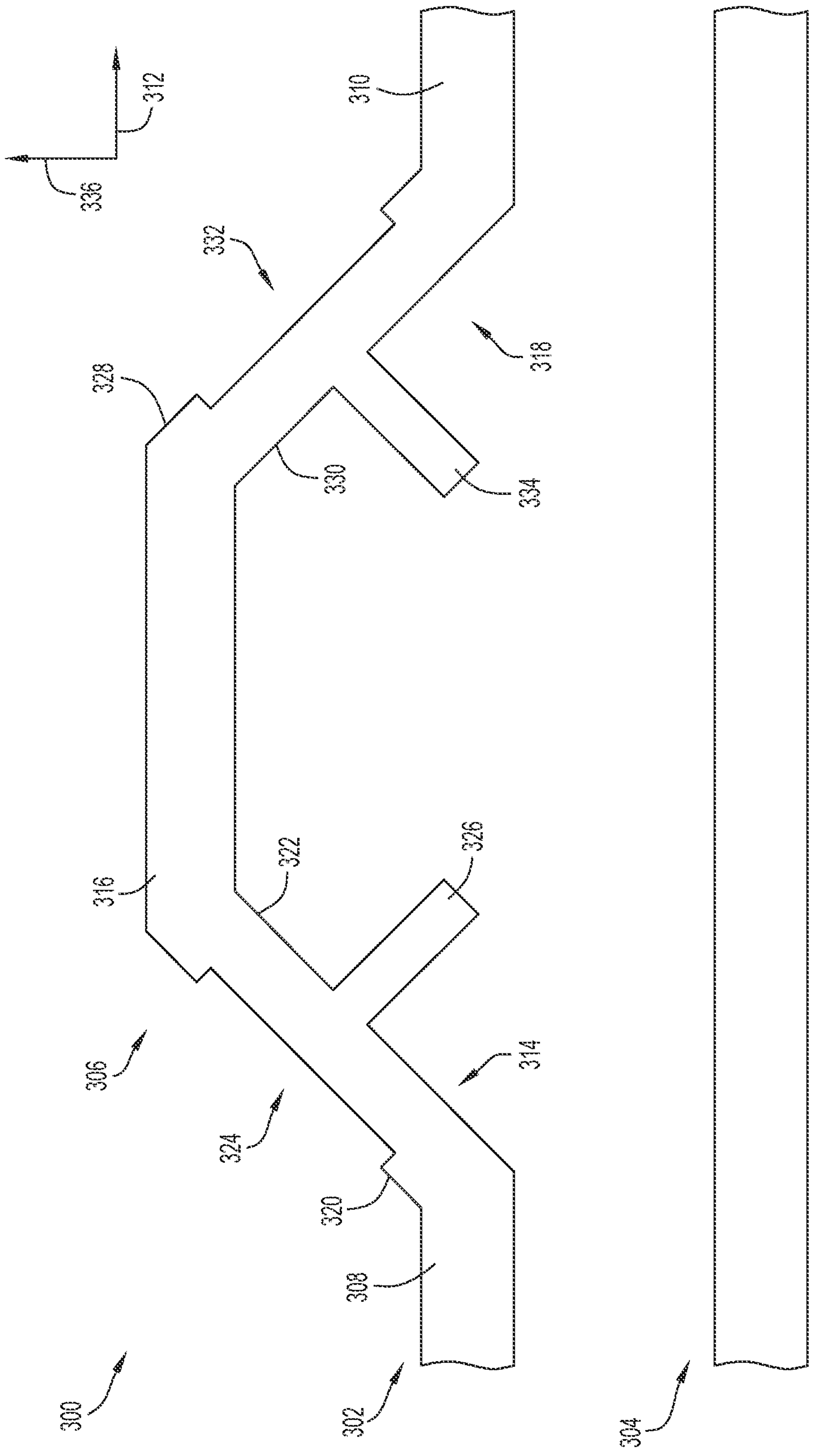

FIG. 4 is a schematic diagram of a portion of a pair of traces 300 that includes a first trace 302 and a second trace 304. The first trace 302 may include a bend 306, whereas the second trace 304 may extend linearly (e.g., does not include a bend). The first trace 302 may include a first outer segment 308 and a second outer segment 310 extending along (e.g., parallel to) a first axis 312 (e.g., a longitudinal axis) outside of the bend 306. For instance, the first outer segment 308 and the second outer segment 310 may be collinear with one another. Additionally, the first trace 302 may include a first bend segment 314 extending from the first outer segment 308 in a direction transverse to (e.g., obliquely to) the first axis 312, a second bend segment 316 extending from the first bend segment 314 along (e.g., parallel to) the first axis 312, and a third bend segment 318 extending from the second bend segment 316 to the second outer segment 310 in a direction transverse to (e.g., obliquely to) the first axis 312. As such, the bend segments 314, 316, 318 may cooperatively form a U-shaped or a V-shaped configuration, and the first bend segment 314 and the third bend segment 318 may be symmetrical about the second bend segment 316. However, in additional or alternative embodiments, the bend segments 314, 316, 318 may have any suitable arrangement, including an asymmetrical configuration. Moreover, the bend 306 may include any suitable quantity of bend segments, including two bend segments or more than three bend segments.

The first bend segment 314 and/or the third bend segment 318 that extend transverse to the first axis 312 may include formations. As an example, the first bend segment 314 may include a first side 320 and a second side 322, opposite the first side 320. A first cutout 324 may be formed into the first side 320 and extend toward the second side 322 to increase an inductance of the first bend segment 314. Additionally, a first extension 326 may extend from the second side 322 toward the second trace 304 to decrease the inductance and increase a capacitance of the first bend segment 314. Similarly, the third bend segment 318 may include a first side 328 and a second side 330, opposite the first side 328. A second cutout 332 may be formed into the first side 328 and extend toward the second side 330 to increase an inductance of the third bend segment 318, and a second extension 334 may extend from the second side 330 toward the second trace 304 to decrease the inductance and increase a capacitance of the third bend segment 318. Each of the cutouts 324, 332 and the extensions 326, 334 may extend obliquely relative to the first axis 312 and/or relative to a second axis 336 (e.g., a lateral axis). For instance, each of the first bend segment 314 and the third bend segment 318 may extend obliquely relative to the first axis 312 and relative to the second axis 336, and the cutouts 324, 332 and the extensions 326, 334 may extend perpendicular to the extension of the first bend segment 314 and of the third bend segment 318, respectively. As such, the extensions 326, 334 may extend toward one another along the first axis 312 in addition to extending toward the second trace 304.

In the illustrated embodiment, the second bend segment 316 does not include any formations (e.g., any cutouts or extensions). However, in additional or alternative embodiments, the second bend segment 316 may include a cutout and/or an extension (e.g., extending toward the second trace 304, extending toward one of the other extensions 326, 334). Thus, any of the bend segments 314, 316, 318 cooperatively forming the bend 306 may include a suitable formation.

Figure 5:
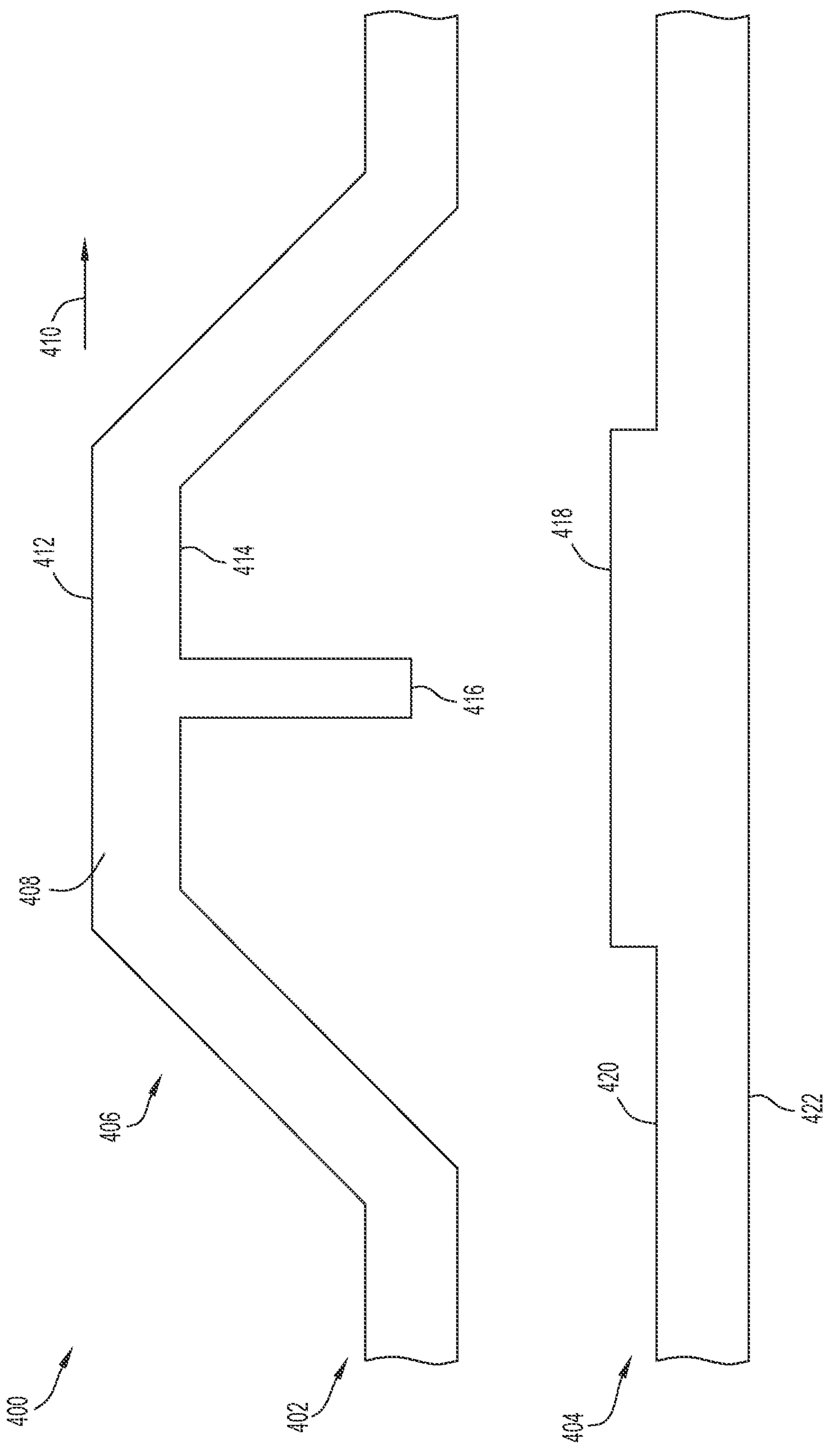

FIG. 5 is a schematic diagram of a portion of a pair of traces 400 that includes a first trace 402 and a second trace 404. The first trace 402 may include a bend 406 that may have a linear segment 408 extending along (e.g., parallel to) an axis 410 (e.g., a longitudinal axis). The linear segment 408 may include a first side 412 and a second side 414, opposite the first side 412, and a first extension 416 extending from the second side 414 toward the second trace 404. However, the linear segment 408 may not include a cutout.

The second trace 404 may generally extend linearly along (e.g., parallel to) the axis 410. However, the second trace 404 may include a second extension 418, which has a rectangular shape in the illustrated embodiment but can have any other suitable shape in additional or alternative embodiments. As an example, the second trace 404 may include a first side 420 and a second side 422, opposite the first side 420, and the second extension 418 may extend from the first side 420 toward the first trace 402. The illustrated extensions 416, 418 overlap with one another along the axis 410, but in additional or alternative embodiments, the extensions 416, 418 may be offset from one another along the axis 410. For instance, the second extension 418 may extend from a portion of the second trace 404 that is offset from the bend 406 along the axis 410.

The extensions 416, 418 may cooperatively tune properties of the traces 402, 404 toward one another. By way of example, the first extension 416 may significantly increase the capacitance of the first trace 402 and also slightly decrease the inductance of the first trace 402. The second extension 418 may slightly increase the capacitance of the second trace 404 and also significantly decrease the inductance of the second trace 404. The significant increase of the capacitance of the first trace 402 provided by the first extension 416 may compensate for the slight increase of the capacitance of the second trace 404 provided by the second extension 418 to cause the capacitance of the first trace 402 and of the second trace 404 to be approximately equal to one another. Additionally, the significant decrease of the inductance of the second trace 404 provided by the second extension 418 may compensate for the slight increase of the inductance of the first trace provided by the first extension 416 to cause the inductance of the first trace 402 and of the second trace 404 to be approximately equal to one another. In this way, the extensions 416, 418 may cause the inductance and the capacitance of the first trace 402 and of the second trace 404 to be approximately equal to one another without having to form a cutout into either of the traces 402, 404. However, a cutout may additionally or alternatively be formed (e.g., into the first trace 402, into the second trace 404) to adjust the inductance and/or the capacitance of the first trace 402 and of the second trace 404 to be approximately equal to one another.

It should be noted that any suitable combination of features described with respect to any of the pairs of traces 150, 250, 300, 400 may be implemented in other pairs of traces. As an example, in certain embodiments, such as embodiments in which traces have a similar capacitance and substantially different inductances, one or more cutouts may be formed into at least one trace of a pair of traces for tuning an inductance, but neither trace of the pair of traces may have an extension that otherwise would tune a capacitance. As another example, a cutout may be formed and an extension may extend from the same side of a trace. That is, a cutout and an extension may be positioned sequentially along the trace instead of at opposite sides of the trace. As a further example, multiple cutouts may be formed into a single linear segment (e.g., at the same side of the linear segment, at opposite sides of the linear segment, and/or multiple extensions may extend from one another (e.g., to form a cross-shaped extension extending from one of the traces). Indeed, any suitable formation may be provided to adjust the inductance and/or the capacitance of the traces toward one another.

Figure 6:
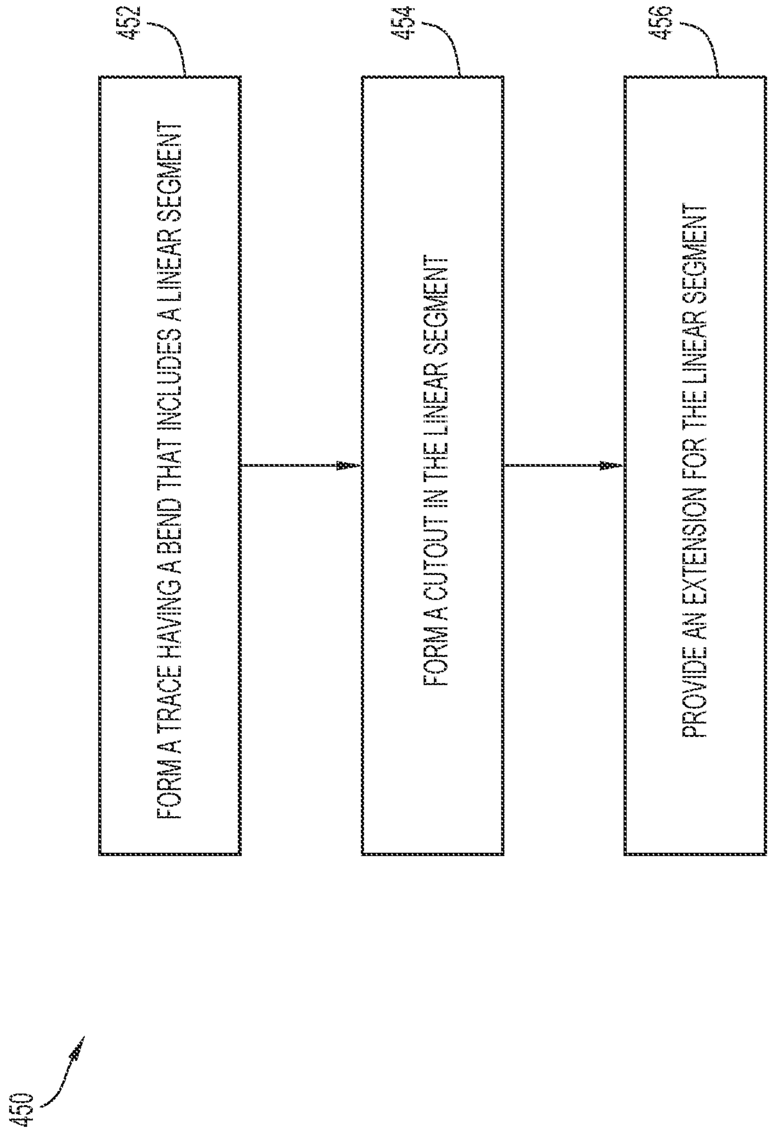
FIG. 6 is a flowchart of a method for manufacturing a trace for a PCB, the trace having formations to propagate signals desirably, according to an example embodiment.

FIG. 6 is a flowchart of a method 450 for manufacturing a trace of a PCB, such as any of the traces of a pair of traces (e.g., a differential pair) discussed herein. In certain embodiments, the method 450 may be performed automatically by one or more entities, such as a processor executing instructions stored on a memory. In additional or alternative embodiments, the method 450 may be performed manually, such as by an operator. It should be noted that the method 450 may be performed differently than depicted. For example, additional operations may be performed, any of the depicted operations may not be performed, and/or the depicted operations may be performed in a different order.

At step 452, a trace having a bend that includes a linear segment may be formed. As an example, the trace may have a first outer segment and a second outer segment that are each outside of the bend and extending along an axis (e.g., a longitudinal axis). Additionally, the trace may include multiple segments that cooperatively form the bend. Such segments may include multiple linear segments, of which at least a subset extends transverse (e.g., obliquely) to the axis. For instance, the linear segments may cooperatively form a U-shaped or a V-shaped configuration. Moreover, at least one of the linear segments of the bend may extend along the axis.

At step 454, a cutout may be formed into the linear segment. For example, the linear segment may include a first side and a second side, opposite the first side, that linearly extend alongside one another and along the axis, and the cutout may be formed into one of the sides and toward the other side. In some embodiments, the cutout may have a rectangular shape. In addition, the cutout may terminate substantially prior to the second side, such as prior to a center axis extending along the linear segment midway between the first side and the second side or between the center axis and the second side. Thus, the cutout may be arranged to avoid changing a direction of signals propagated along the trace. The cutout may adjust (e.g., increase) an inductance of the trace.

At step 456, an extension may be provided for the linear segment. The extension may extend from another of the first side and the second side, such as toward the other trace of the pair of traces. The extension may adjust (e.g., increase) a capacitance of the trace and adjust (e.g., decrease) an inductance of the trace. For example, the extension and the cutout may cooperatively adjust the capacitance and the inductance of the trace to be approximately equal to that of the other trace of the pair of traces to reduce EMI that otherwise may occur as a result of a difference between inductance and/or capacitance of the trace and of the other trace. In some embodiments, the extension may be rectangularly shaped. Furthermore, the extension may be offset from an end of the cutout (e.g., the extension may overlap with one of the linearly extending sides of the linear segment) and the cutout may not extend into the extension to avoid changing a direction of signals propagated along the trace. As such, the cutout and the extension may change the inductance and/or the capacitance of the trace without changing a distance and a duration of time in which the signals may propagate to traverse the trace, thereby avoiding skew between the trace and the other trace that otherwise may affect signal integrity. Therefore, a desirable performance of the PCB provided by the pair of traces may be achieved.

In some embodiments, one or more formations may be provided to the other trace of the pair of traces. For instance, an extension may be provided to the other trace to extend between the traces and reduce the inductance of the other trace. Furthermore, in some embodiments, one of a cutout or an extension, but not the other a cutout or an extension, may be implemented for a trace. In other words, a trace may have a cutout and not extension or a trace may have an extension and no cutout. Further still, an operation of the method 450 may be performed multiple times to form multiple cutouts and/or to provide multiple extensions for a single trace (e.g., at the same linear segment).

In some aspects, the techniques described herein relate to an apparatus including: a layer of a printed circuit board; and a trace routed along the layer of the printed circuit board, wherein the trace includes a bend partially formed by a linear segment extending parallel to an axis, the linear segment includes a first side and a second side, opposite the first side, that each extend parallel to the axis, the linear segment includes a cutout formed into the first side toward the second side, and an end of the cutout overlaps with the second side along the axis.

In some aspects, the techniques described herein relate to an apparatus, wherein an additional end of the cutout, offset from the end of the cutout along the axis, overlaps with the second side along the axis.

In some aspects, the techniques described herein relate to an apparatus, wherein the trace includes an extension extending from the second side of the trace.

In some aspects, the techniques described herein relate to an apparatus, wherein the extension is offset from each end of the cutout.

In some aspects, the techniques described herein relate to an apparatus, further including an additional trace routed adjacent to the trace, wherein the extension extends between the trace and the additional trace.

In some aspects, the techniques described herein relate to an apparatus, wherein the extension overlaps with the cutout along the axis.

In some aspects, the techniques described herein relate to an apparatus, wherein the cutout terminates prior to the second end.

In some aspects, the techniques described herein relate to an apparatus, wherein the trace includes an outer segment that is outside of the bend, and the linear segment extends from the outer segment and parallel to the axis in a direction transverse to extension of the outer segment.

In some aspects, the techniques described herein relate to an apparatus including: a layer of a printed circuit board; a first trace routed along the layer of the printed circuit board; and a second trace routed along the layer of the printed circuit board, wherein the second trace includes a bend at least partially formed by a segment, wherein the second trace includes an extension extending from the segment toward the first trace.

In some aspects, the techniques described herein relate to an apparatus, wherein the first trace includes an additional extension extending toward the second trace.

In some aspects, the techniques described herein relate to an apparatus, wherein each of the first trace and the segment of the second trace extends along an axis, and the extension of the second trace and the additional extension of the first trace overlap with one another along the axis.

In some aspects, the techniques described herein relate to an apparatus, wherein the first trace and the second trace are a differential pair.

In some aspects, the techniques described herein relate to an apparatus, wherein the first trace extends linearly along the bend of the second trace.

In some aspects, the techniques described herein relate to an apparatus, wherein the segment of the second trace is absent of a cutout.

In some aspects, the techniques described herein relate to an apparatus including: a layer of a printed circuit board; and a trace routed along the layer of the printed circuit board, wherein the trace includes a bend partially formed by a linear segment extending along an axis, the linear segment includes a cutout formed into a first side of the linear segment, and the linear segment includes an extension extending from a second side, opposite the first side, of the linear segment, and the cutout and the extension are offset from one another along the axis.

In some aspects, the techniques described herein relate to an apparatus, including an outer segment that is outside of the bend, wherein the outer segment extends along the axis.

In some aspects, the techniques described herein relate to an apparatus, including an additional linear segment partially forming the bend, wherein the additional linear segment extends from the outer segment to the linear segment in a direction transverse to the axis.

In some aspects, the techniques described herein relate to an apparatus, wherein the trace includes an additional extension extending from the second side of the linear segment and overlapping with the cutout along the axis.

In some aspects, the techniques described herein relate to an apparatus, wherein the additional extension is offset from each end of the cutout.

In some aspects, the techniques described herein relate to an apparatus, wherein the linear segment includes an additional extension extending from the second side of the linear segment, and the additional extension and the cutout are offset from one another along the axis such that ends of the cutout are positioned between the extension and the additional extension along the axis.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:

a layer of a printed circuit board;

a trace routed along the layer of the printed circuit board, wherein the trace comprises a bend partially formed by a linear segment extending parallel to an axis, the linear segment includes a first side and a second side, opposite the first side, that each extend parallel to the axis, the linear segment includes a cutout formed into the first side toward the second side, the linear segment comprises an extension extending from the second side, and the second side lacks any cutout; and an additional trace routed along the layer of the printed circuit board, wherein the second side faces the additional trace.

2. The apparatus of claim 1, wherein ends of the extension are positioned between ends of the cutout along the axis.

3. The apparatus of claim 1, wherein the trace comprises an additional extension extending from the second side of the trace.

4. The apparatus of claim 3, wherein each of the extension and the additional extension is offset from the cutout along the axis.

5. The apparatus of claim 1, wherein the extension is offset from each end of the cutout along the axis.

6. The apparatus of claim 1, wherein the bend of the trace extends away from the additional trace to increase a space formed between the trace and the additional trace, and the extension extends into the space.

7. The apparatus of claim 1, wherein the cutout terminates prior to the second side.

8. The apparatus of claim 1, wherein the trace comprises an outer segment that is outside of the bend, and the linear segment extends from the outer segment and parallel to the axis in a direction transverse to extension of the outer segment.

9. An apparatus comprising:

a layer of a printed circuit board;

a first trace routed along the layer of the printed circuit board, wherein the first trace includes a first extension; and a second trace routed along the layer of the printed circuit board, wherein the second trace comprises a bend at least partially formed by a segment extending along an axis, wherein the second trace comprises a second extension extending from the segment toward the first trace, the first extension of the first trace extends toward the second trace, and ends of the second extension are positioned between ends of the first extension along the axis.

10. The apparatus of claim 9, wherein the bend of the second trace extends away from the first trace to increase a space between the first trace and the second trace at the segment, and the second extension extends into the space toward the first trace.

11. The apparatus of claim 9, wherein each of the first trace and the segment of the second trace extends along the axis.

12. The apparatus of claim 9, wherein the first trace and the second trace are a differential pair.

13. The apparatus of claim 9, wherein the first trace extends parallel to the segment of the second trace.

14. The apparatus of claim 9, wherein the segment of the second trace is absent of a cutout.

15. An apparatus comprising:

a layer of a printed circuit board; and a trace routed along the layer of the printed circuit board, wherein the trace comprises a bend partially formed by a linear segment extending along an axis, the linear segment comprises a cutout formed into a first side of the linear segment, the linear segment comprises an extension extending from a second side, opposite the first side, of the linear segment, the cutout and the extension are offset from one another along the axis, the linear segment comprises an additional extension extending from the second side, and ends of the additional extension are positioned between ends of the cutout along the axis.

16. The apparatus of claim 15, comprising an outer segment that is outside of the bend, wherein the outer segment extends along the axis.

17. The apparatus of claim 16, comprising an additional linear segment partially forming the bend, wherein the additional linear segment extends from the outer segment to the linear segment in a direction transverse to the axis.

18. The apparatus of claim 15, wherein the trace comprises a further extension extending from the second side of the linear segment and offset from the cutout along the axis.

19. The apparatus of claim 15, wherein the bend forms a space, and the first side of the linear segment faces the space such that the extension extends into the space.

20. The apparatus of claim 15, wherein the second side of the linear segment lacks any cutout.

* * * * *